(12) United States Patent
Koniaris et al.

(10) Patent No.: US 8,253,434 B2
(45) Date of Patent: Aug. 28, 2012

(54) CLOSED LOOP FEEDBACK CONTROL OF INTEGRATED CIRCUITS

(76) Inventors: Kleanthes G. Koniaris, Palo Alto, CA (US); James B. Burr, Foster City, CA (US)

( * ) Notice: Subject to any disclaimer, the term of this patent is extended or adjusted under 35 U.S.C. 154(b) by 422 days.

(21) Appl. No.: 12/651,244

(22) Filed: Dec. 31, 2009

(65) Prior Publication Data

US 2010/0097092 A1 Apr. 22, 2010

Related U.S. Application Data

(63) Continuation of application No. 12/037,784, filed on Feb. 26, 2008, now Pat. No. 7,671,621, which is a continuation of application No. 11/490,356, filed on Jul. 19, 2006, now Pat. No. 7,336,092, which is a continuation of application No. 10/956,207, filed on Sep. 30, 2004, now Pat. No. 7,180,322, which is a continuation-in-part of application No. 10/124,152, filed on Apr. 16, 2002, now Pat. No. 6,882,172, which is a continuation-in-part of application No. 10/672,793, filed on Sep. 26, 2003, now Pat. No. 6,885,210, and a continuation-in-part of application No. 10/334,918, filed on Dec. 31, 2002, now Pat. No. 7,941,675.

(51) Int. Cl.
*G01R 31/02* (2006.01)
*G01R 31/26* (2006.01)

(52) U.S. Cl. .............................. 324/762.09; 324/762.01

(58) Field of Classification Search ....................... None
See application file for complete search history.

(56) References Cited

U.S. PATENT DOCUMENTS

| | | | |
|---|---|---|---|
| 7,112,978 B1 * | 9/2006 | Koniaris et al. | 324/750.3 |
| 7,180,322 B1 * | 2/2007 | Koniaris et al. | 324/762.01 |
| 7,336,090 B1 * | 2/2008 | Koniaris et al. | 324/750.3 |
| 7,336,092 B1 * | 2/2008 | Koniaris et al. | 324/750.3 |
| 7,626,409 B1 * | 12/2009 | Koniaris et al. | 324/760.01 |
| 7,671,621 B2 * | 3/2010 | Koniaris et al. | 324/762.09 |
| 8,040,149 B2 * | 10/2011 | Koniaris et al. | 324/762.01 |
| 2008/0143372 A1 * | 6/2008 | Koniaris et al. | 324/769 |
| 2010/0060306 A1 * | 3/2010 | Koniaris et al. | 324/763 |
| 2012/0001651 A1 * | 1/2012 | Koniaris et al. | 324/762.01 |

* cited by examiner

*Primary Examiner* — Jermele M Hollington

(57) ABSTRACT

Systems and methods for closed loop feedback control of integrated circuits. In one embodiment, a plurality of controllable inputs to an integrated circuit is adjusted to achieve a predetermined value of a dynamic operating indicator of the integrated circuit. An operating condition of an integrated circuit is controlled via closed loop feedback based on dynamic operating indicators of the integrated circuit's behavior.

30 Claims, 5 Drawing Sheets

CLOSED LOOP FEEDBACK CONTROL OF INTEGRATED CIRCUITS

RELATED APPLICATIONS

This is a Continuation Application of, and claims benefit to, U.S. patent application Ser. No. 12/037,784, now U.S. Pat. No. 7,671,621, filed Feb. 26, 2008, to Koniaris and Burr, which is hereby incorporated herein by reference in its entirety, which in turn was a Continuation Application of, and claims benefit to, U.S. Pat. No. 7,336,092, filed Jul. 19, 2006, to Koniaris and Burr, which is hereby incorporated herein by reference in its entirety, which was a continuation U.S. Pat. No. 7,180,322, filed on Sep. 30, 2004, which is hereby incorporated in its entirety by reference to this specification.

This application is a continuation in part U.S. patent application Ser. No. 10/124,152, now U.S. Pat. No. 6,882,172, filed Apr. 16, 2002, entitled "System and Method for Measuring Transistor Leakage Current with a Ring Oscillator" to Suzuki and Burr, which is hereby incorporated herein by reference in its entirety.

This application is a continuation in part of U.S. patent application Ser. No. 10/672,793, now U.S. Pat. No. 6,885,210, filed Sep. 26, 2003, entitled "A System and Method for Measuring Transistor Leakage Current with a Ring Oscillator with Backbias Controls" to Suzuki, which is hereby incorporated herein by reference in its entirety.

FIELD OF THE INVENTION

Embodiments in accordance with the present invention relate to systems and methods for closed loop feedback control of integrated circuits.

BACKGROUND

In order to operate an integrated circuit, e.g., a microprocessor, in an efficient manner, for example, to consume a low amount of energy to accomplish a task, it is known to adjust various controlling parameters. These parameters may include an operating voltage that can be adjusted to a value characteristic of an advantageous power condition in accordance with the task to be accomplished. For example, an operating voltage is set to a minimized value consistent with a desired frequency of operation. In the conventional art, such operating points are applied in an open loop manner.

SUMMARY OF THE INVENTION

Therefore, systems and methods for closed loop feedback control of integrated circuits are highly desired.

Accordingly, systems and methods for closed loop feedback control of integrated circuits are disclosed. In one embodiment, a plurality of controllable inputs to an integrated circuit is adjusted to achieve a predetermined value of a dynamic operating indicator of the integrated circuit. An operating condition of an integrated circuit is controlled via closed loop feedback based on dynamic operating indicators of the measured behavior of the integrated circuit.

In accordance with other embodiments of the present invention, a plurality of controllable input values to an integrated circuit is determined that achieves a desirably low power operating condition of the integrated circuit for a given operating frequency.

In accordance with yet other embodiments of the present invention, a dynamic operating condition of an integrated circuit is measured for a specific operating frequency at controllable input values that achieve an advantageous low power operating condition of the integrated circuit.

In one exemplary embodiment of the present invention, the integrated circuit is a microprocessor capable of operating at various frequencies and voltages.

DETAILED DESCRIPTION OF THE INVENTION

Figure 1:
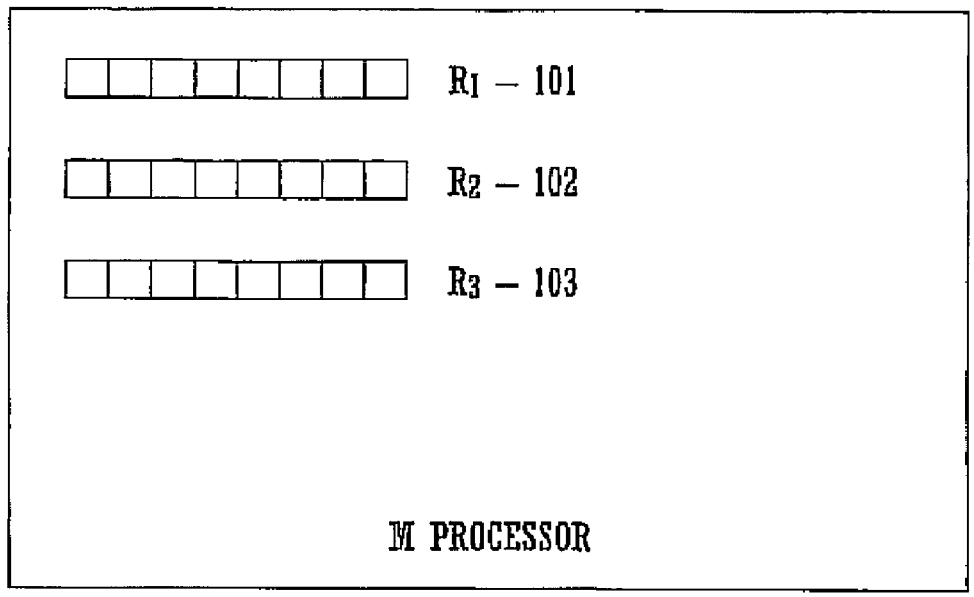
FIG. 1 illustrates a microprocessor comprising dynamic condition reporting registers, in accordance with embodiments of the present invention.

In the following detailed description of the present invention, system and method for closed loop feedback control of integrated circuits, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions that follow (e.g., process 200) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing" or "dividing" or "computing" or "testing" or "calculating" or "determining" or "storing'" or "measuring" or "adjusting" or "generating" or "performing" or "comparing" or "synchronizing" or "accessing'" or "retrieving'" or "conveying'" or "sending" or "resuming'" or "installing" or "gathering" or the like, refer to the action and processes of a computer system, processor, or similar electronic computing device that manipulates and transforms data represented as physical (electronic) quantities within the computer system's registers and memories into other data similarly represented as physical quantities within the computer system memories or registers or other such information storage, transmission or display devices.

Closed Loop Feedback Control of Integrated Circuits

Embodiments in accordance with the present invention are described in the context of design and operation of integrated semiconductors. More particularly, embodiments of the present invention relate to systems and methods for closed loop feedback control of integrated circuits. It is appreciated, however, that elements of the present invention may be utilized in other areas of semiconductor operation.

Several operational indicators of an integrated circuit, e.g., a microprocessor, can be measured dynamically, e.g., in-situ while the integrated circuit is in operation. For example, the operating temperature of the integrated circuit can be measured. Such measurements can be external, e.g., via an applied thermocouple, or they can be made internally, e.g., via on-chip measurement circuits.

A wide variety of integrated circuit characteristics can be measured or determined, either directly or inferred from other characteristics, while the device is operating. For example, in addition to temperature, other characteristics such as gate delays, metal delays, leakage current, "on" or active current, relative behavior of NMOS and PMOS devices, maximum frequency and the like can be measured or determined for the instant operating conditions of an integrated circuit. Co-pending, commonly owned U.S. patent application Ser. No. 10/124,152, filed Apr. 16, 2002, entitled "System and Method for Measuring Transistor Leakage Current with a Ring Oscillator" and incorporated by reference herein, provides exemplary systems and methods of such dynamic determinations, or dynamic operating indicators, that are well suited to embodiments in accordance with the present invention.

Such measurements or indications are typically made available, e.g., to state machines and/or processor control software, via registers. Such register values frequently comprise a count of a number of events, e.g., oscillations of a ring oscillator in a given time interval. It is appreciated that there are many methods of creating such indications, and all such indications are well suited to embodiments in accordance with the present invention. For the purpose of illustrating embodiments in accordance with the present invention, a model of a register reporting a value that is correlated to an operating characteristic of an integrated circuit is employed. It is to be appreciated, however, that embodiments in accordance with the present invention are well suited to a variety of systems and methods of determining and reporting dynamic operating conditions of an integrated circuit.

FIG. 1 illustrates a microprocessor 100 comprising dynamic condition reporting registers, in accordance with embodiments of the present invention. Dynamic condition reporting registers R1 101, R2 102 and R3 103 each indicate a dynamic condition metric of microprocessor 100. For example, generally each dynamic condition reporting register is associated with a dynamic condition measuring circuit either as a part of the integrated circuit or external to the integrated circuit. Conversion of a measured quantity, e.g., oscillations of a particular ring oscillator, into a usable metric related to the measured quantity, e.g., a frequency measurement, e.g., in hertz, or a count of oscillations per unit time, can be embodied in either software or hardware, and all such embodiments are to be considered within the scope of the present invention. For example, logic circuitry can increment a counting register for each oscillation for a period of time. If the count exceeds a predetermined limit, an interrupt can be created to enable software adjustment of a feedback loop. Alternatively, for example, a software timing loop, with or without hardware timing assistance, can count a number of oscillations per unit time. In accordance with embodiments of the present invention, dynamic condition reporting registers, e.g., dynamic condition reporting registers R1 101, R2 102 and R3 103, can refer to any memory location utilized to store such indications of a dynamic condition.

As operating conditions of microprocessor 100 change, values reported by dynamic condition reporting registers R1 101, R2 102 and R3 103 will generally change. For example, operating voltage and operating temperature are strong influences on a maximum operating frequency achievable by an integrated circuit. As operating voltage and/or operating temperature vary, so too in general will the values reported by dynamic condition reporting registers R1 101, R2 102 and R3 103.

For example, dynamic condition reporting register R1 101 can indicate a number of oscillations per time of a ring oscillator comprising complementary metal oxide inverter gates. Such a circuit can be utilized to indicate gate delays for the microprocessor at the instant operating conditions, e.g., operating temperature, operating voltage and the like. Similarly, other dynamic condition reporting registers can indicate other operational characteristics of microprocessor 100. For example, device leakage, gate leakage, temperature, metal delays, "on" current, behavior of n type and p type devices and/or relative behavior of n type and p type devices can be reported by dynamic condition reporting registers.

Most useful dynamic conditions indications will have a correlation with maximum achievable operating frequency of an integrated circuit at those operating conditions. For example, an indication of operating temperature will generally have a negative correlation with maximum achievable operating frequency (for operating voltages above about 0.6 volts). For example, as operating temperature increases, maximum achievable operating frequency generally decreases. Other dynamic condition indications may have a positive correlation with maximum achievable operating frequency. For example, the number of oscillations of a NAND-gate ring oscillator per unit time will generally increase as maximum achievable operating frequency of an integrated circuit increases.

Such correlations among dynamic conditions and maximum achievable operating frequency can be utilized in a system of closed loop feedback involving the condition registers, to optimize power consumption for operating an integrated circuit at a particular frequency.

Figure 2:
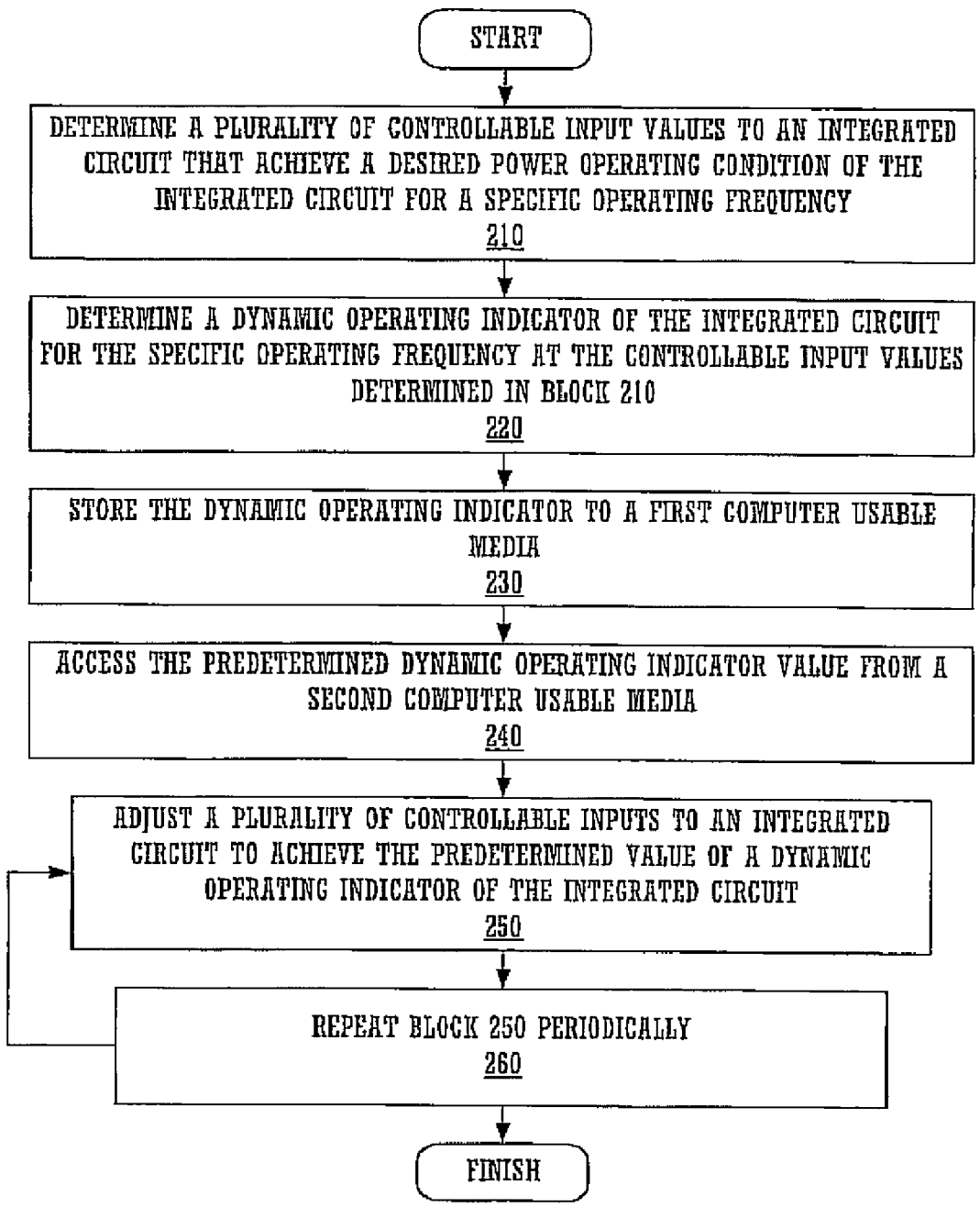
FIG. 2 illustrates a method of operating an integrated circuit, in accordance with embodiments of the present invention.

FIG. 2 illustrates a process 200 of operating an integrated circuit, in accordance with embodiments of the present invention. In optional block 210, a plurality of controllable input values to an integrated circuit is determined that achieves a desired power operating condition of the integrated circuit for a given operating frequency. In accordance with one embodiment of the present invention, the condition is a desired low power operating condition. Exemplary controllable inputs to an integrated circuit can include, for example, operating voltage(s), body biasing voltage(s) applied to NMOS devices and/or body biasing voltage(s) applied to PMOS devices.

For example, an integrated circuit tester can run test vectors against an integrated circuit at a particular operating frequency for a fixed operating temperature. Controllable inputs to the integrated circuit, e.g., operating voltage(s) and/or body biasing voltage(s), can be adjusted to decrease power consumption of the integrated circuit consistent with proper operation at the particular operating frequency. Power consumption of the integrated circuit should be minimized consistent with proper operation at the particular operating frequency. Block 200 can be repeated for a plurality of different operating frequencies and/or temperatures.

In optional block 220, a dynamic operating indicator of the integrated circuit is observed for the specific operating frequency at the controllable input values determined in block 210. For example, a dynamic condition reporting register value corresponding to a ring oscillator can be read, either by an integrated circuit tester or under software control. It is to be appreciated that such dynamic operating conditions are generally determined in digital form, e.g., as a count of events. However, embodiments in accordance with the present invention are well suited to the use of analog condition reporting, e.g., a condition expressed as a voltage or charge stored on a floating gate.

In optional block 230, the dynamic operating indicator value is stored to a first computer usable media. Such a dynamic operating condition value is well suited to a wide variety of storing methods and media. For example, such a value can be stored in non-volatile memory of the integrated circuit, in non-volatile memory of an integrated circuit package, or on media separate from the integrated circuit, e.g., on a separate non-volatile memory integrated circuit or in a computer system database. In accordance with an embodiment of the present invention, the indicator may be stored in a register of a microprocessor.

In optional block 240, the predetermined dynamic operating indicator value is accessed from a second computer usable media. It is to be appreciated that the first and second computer usable media can be the same media. Alternatively, the first and second computer usable media can be separate media. Embodiments in accordance with the present invention are well suited to utilizing a wide variety of media and techniques known to the data processing arts to transfer information of the dynamic operating condition between the first and second computer usable media.

It is to be appreciated that the predetermined dynamic operating indicator value is generally frequency specific. Consequently, if it is desirable to operate the integrated circuit at a different operating frequency, block 240 may be repeated to obtain a predetermined dynamic operating indicator value corresponding to the different operating frequency.

In block 250, a plurality of controllable inputs to an integrated circuit is adjusted to achieve the predetermined value of a dynamic operating indicator of the integrated circuit. It is to be appreciated that, in general, each controllable input can be adjusted independently of other such controllable inputs. In some cases, a range of controllable input values, e.g., a body bias voltage, can be influenced by another controllable input value, e.g., operating voltage. In optional block 260, block 250 is periodically repeated.

In accordance with embodiments of the present invention, the predetermined dynamic operating condition can be determined for a specific integrated circuit or for a group of integrated circuits, e.g., those from a common wafer, a production run or by part number.

In accordance with other embodiments of the present invention, the predetermined dynamic operating condition may comprise evaluation of a function and/or lists of values. Such a function may present a condition that the system attempts to have dynamic operating indicators meet. For example, it may be desirable to control a combination of dynamic operating condition values. Referring once again to FIG. 1, the predetermined dynamic operating condition could be determined as three times the value of register R1 101 squared plus 17 times the value of register R2 102 plus the value of register R3 103. Other functions and/or operations, e.g., boundary operations such as MIN and MAX, can further be applied to dynamic operating condition values. All such manipulations of dynamic operating condition values to form a predetermined dynamic operating condition are well suited to embodiments in accordance with the present invention.

In this novel manner, an operating condition of an integrated circuit, e.g., power consumption of a microprocessor, can be advantageously controlled via closed loop feedback based on dynamic operating indicators of the integrated circuit's behavior. Under the conventional art, controllable inputs to an integrated circuit, e.g., operating voltage, were based on open loop methods that provided, for example, a recommended operating voltage for a given operating frequency and/or temperature.

Figure 3A:
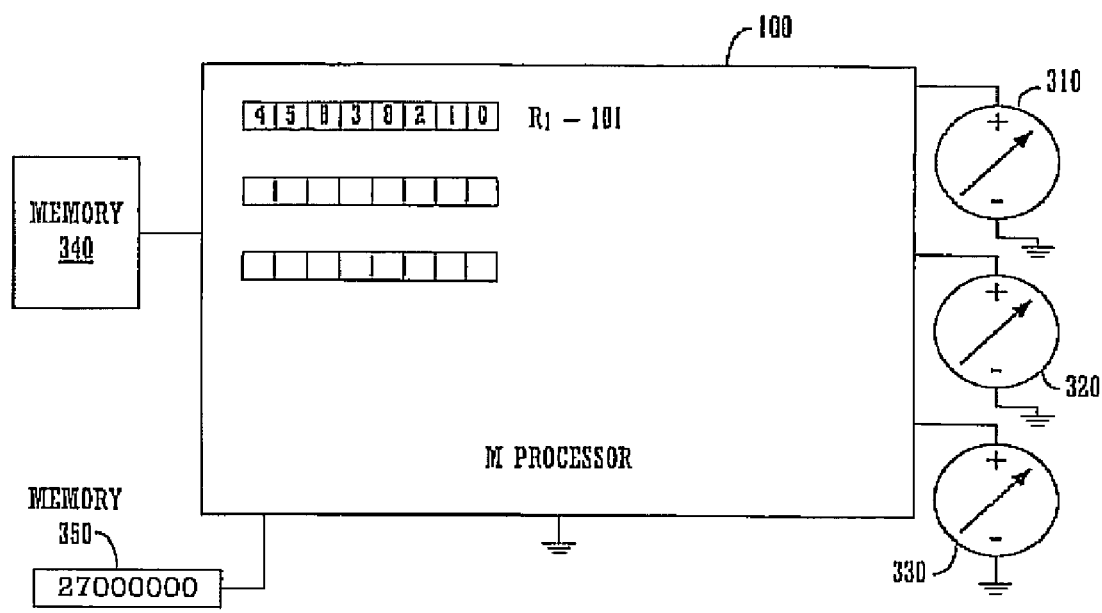
FIGS. 3A and 3B illustrate an exemplary application of portions of a method of operating an integrated circuit, in accordance with embodiments of the present invention.
Figure 3B:
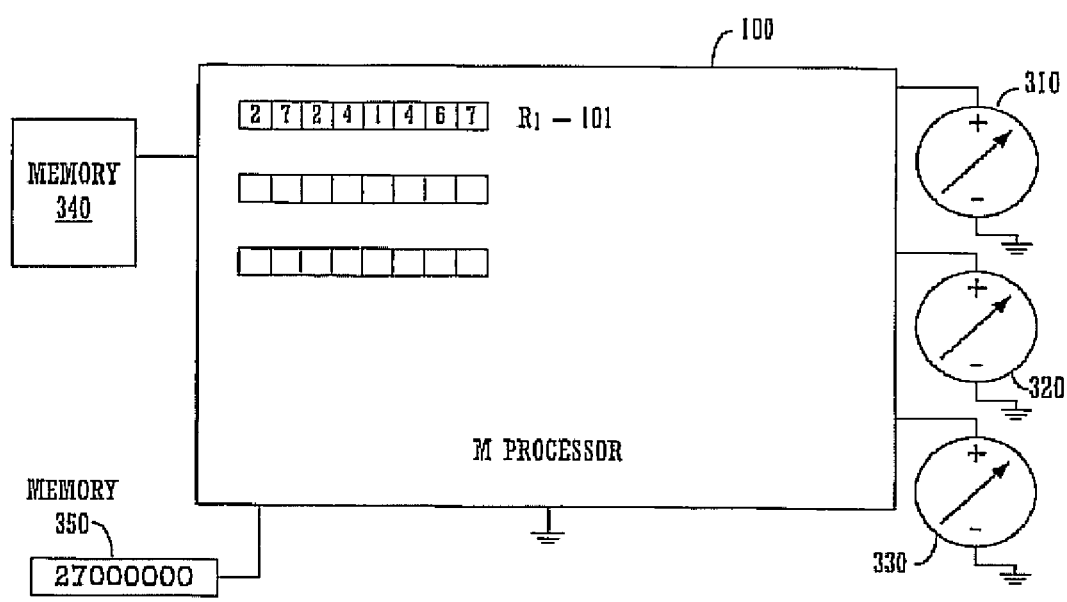

FIGS. 3A and 3B illustrate an exemplary application of portions of process 200, in accordance with embodiments of the present invention. Computer system 300 comprises microprocessor 100. Microprocessor 100 comprises dynamic condition reporting register R1 101. Dynamic condition reporting register R1 101 indicates a dynamic condition metric of microprocessor 100, e.g., a number of oscillations of a ring oscillator for a given time period. The time period may be externally measured, for example via a stable oscillator, e.g., a quartz oscillator. As operating conditions of microprocessor 100 change, values reported by dynamic condition reporting register R1 101 will generally change. For the purposes of the present example, assume that the value reported by dynamic condition reporting register R1 101 is positively correlated with maximum achievable operating frequency of microprocessor 100. For example, the greater the value in dynamic condition reporting register R1 101, the faster that microprocessor 100 can run. It is appreciated that embodiments in accordance with the present invention are well suited to negative correlations between dynamic condition reporting register values and maximum achievable operating frequency of a microprocessor.

Computer system 300 further comprises a first variable voltage supply 310 to provide an operating voltage to microprocessor 100. Optionally, computer system 300 can comprise a second variable voltage supply 320 to provide a body biasing voltage to n type devices, e.g., NMOS devices, of microprocessor 100. Similarly, computer system 300 can optionally comprise a third variable voltage supply 330 to provide a body biasing voltage to p type devices, e.g., PMOS devices, of microprocessor 100.

Computer system 300 also comprises a memory 340 coupled to microprocessor 100 that can be used to store data and programs for execution on microprocessor 100. Further, computer system 300 comprises a memory 350 for storing a predetermined value for a dynamic condition indicator. Memory 350 is well suited to being a part of memory 340, e.g., a location within memory 350.

The predetermined value for a dynamic condition indicator stored in memory 350, "27000000," represents a value of dynamic condition reporting register R1 101 that was previously determined. For example, this value can represent the value of dynamic condition reporting register R1 101 that corresponds to the lowest power operation of microprocessor 100 at a particular operating frequency, e.g., 500 MHz.

Referring now to FIG. 3A, at a point in time when microprocessor 100 is operating at 500 MHz, dynamic condition reporting register R1 101 reports a value of "45838210." Controllable inputs to microprocessor 100, e.g., operating voltage provided by first variable voltage supply 310 and body biasing voltages provided by second and third variable voltage supplies 320 and 330, are adjusted to achieve the predetermined value for dynamic condition reporting register R1 101, e.g., "27000000." For example, first variable voltage supply 310 can be commanded to reduce the operating voltage provided to microprocessor 100. It is to be appreciated that any or all controllable inputs can be adjusted in any combination and/or sequence in order to achieve the predetermined value for dynamic condition reporting register R1 101, in accordance with embodiments of the present invention.

Referring now to FIG. 3B, after such adjustments of controllable inputs to microprocessor 100, dynamic condition reporting register R1 101 reports a value of "27241467" that is very close to the predetermined value for dynamic condition reporting register R1 101, "27000000." It is to be appreciated that the actual predetermined value for dynamic condition reporting register R1 101 may not be achievable for a variety of reasons, including, for example, an operating temperature difference for microprocessor 100 between the point when the predetermined value for dynamic condition reporting register R1 101 was determined and the point in time represented by FIG. 3B.

Figure 4:
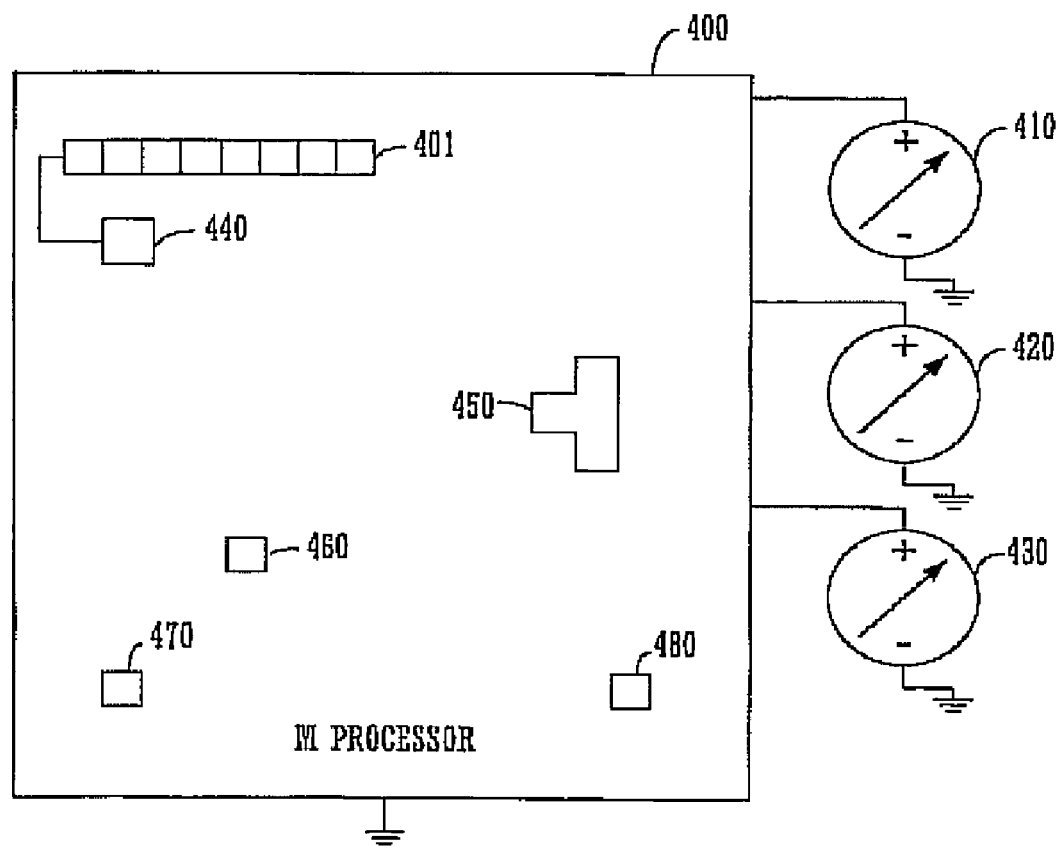
FIG. 4 illustrates a microprocessor, in accordance with embodiments of the present invention.

FIG. 4 illustrates a microprocessor 400, in accordance with embodiments of the present invention. Microprocessor 400 is configured to operate from a plurality of variable voltage supplies or controllable inputs, e.g., variable voltage supplies 410, 420 and 430. Variable voltage supply 410 provides a variable operating voltage to microprocessor 400. Variable voltage supply 420 provides a variable body biasing voltage to n type devices, e.g., NMOS devices, of microprocessor 400. Variable voltage supply 430 provides a variable body biasing voltage to p type devices, e.g., PMOS devices, of microprocessor 400.

Microprocessor 400 further comprises a plurality of dynamic operating indicators for indicating operating conditions of microprocessor 400, e.g., dynamic operating indicator circuits 440, 450, 460, 470, and 480. One or more of dynamic operating indicator circuits 440, 450, 460, 470, and 480 are well suited to the systems and methods taught in commonly owned U.S. patent application Ser. No. 10/124,152, filed Apr. 16, 2002 now U.S. Pat. No. 6,882,172, entitled "System and Method for Measuring Transistor Leakage Current with a Ring Oscillator" and incorporated by reference herein.

Typically such dynamic operating indicator circuits will be situated in a variety of locations throughout a microprocessor integrated circuit. A wide variety of factors, including semiconductor process variation across an integrated circuit and other well known circuit layout influences, should be considered to determine where such dynamic operating indicator circuits are placed. Generally, each dynamic operating indicator circuit, e.g., dynamic operating indicator circuit 440, will have an associated dynamic operating indicator, e.g., register 401. The dynamic operating indicator 401 presents a measurement of a current integrated circuit operating characteristic, as measured by a dynamic operating indicator circuit, to microprocessor circuitry and/or software in a straightforward manner. It is to be appreciated that a direct correspondence between dynamic operating indicator circuits and dynamic operating indicators is exemplary, and that other structures to determine a current integrated circuit operating characteristic are well suited to embodiments in accordance with the present invention. For example, register 401 may represent a plurality of dynamic operating indicators. A selector mechanism can be provided to select which dynamic operating indicator is reported in register 401 at a particular time.

Embodiments in accordance with the present invention, systems and methods for closed loop feedback control of integrated circuits, are thus described. While the present invention has been described in particular embodiments, it should be appreciated that the present invention should not be construed as limited by such embodiments, but rather construed according to the below claims.

What is claimed is:

1. A method, comprising:
    measuring an operating indicator of an integrated circuit that is at least partially frequency dependent to obtain a first measured value of the operating indicator;
    comparing the first measured value of the operating indicator to a first desired value of the operating indicator;
    determining a first value of a first voltage sufficient, if applied to the integrated circuit, to reduce a magnitude of a difference between the first measured value of the operating indicator and the first desired value of the operating indicator; and
    applying the first voltage to the integrated circuit.

2. The method as recited in claim 1, wherein:
    the integrated circuit includes a processor.

3. The method as recited in claim 1, wherein:
    the applying the first voltage to the integrated circuit includes controlling a voltage supply coupled to the integrated circuit to cause the voltage supply to provide the first voltage to the integrated circuit.

4. The method as recited in claim 2, wherein:
    operation of the processor in a first state corresponding to the first measured value of the operating indicator corresponds to greater power consumption by the processor than a level of power consumption by operation of the processor in a second state corresponding to the reduced magnitude of the difference between the first measured value of the operating indicator and the first desired value of the operating indicator.

5. The method as recited in claim 1, wherein:
    the operating indicator is a temperature.

6. The method as recited in claim 2, wherein:
    the operating indicator is a highest frequency at which the processor is properly operable.

7. The method as recited in claim 1, wherein:
    the operating indicator is additionally dependent upon a leakage current.

8. The method as recited in claim 1, further comprising:
    setting an operating frequency of the integrated circuit to a first frequency.

9. The method as recited in claim 8, further comprising:
    changing the operating frequency of the integrated circuit to a second frequency;
    measuring the operating indicator of the integrated circuit to obtain a second measured value of the operating indicator;
    comparing the second measured value of the operating indicator to a second desired value of the operating indicator corresponding to the second frequency;
    determining a second value of a second voltage sufficient, if applied to the integrated circuit, to reduce a magnitude of a difference between the second measured value of the operating indicator and the second desired value of the operating indicator; and
    applying the second voltage to the integrated circuit.

10. The method as recited in claim 1, further comprising:
    repeating each of the measuring of the operating indicator of the integrated circuit, the comparing of a resulting measured value of the operating to the desired value of the operating indicator, the determining of a corresponding value of a voltage, and the applying of the voltage, corresponding to the value of the voltage, to the integrated circuit a number of times sufficient to reduce the magnitude of the difference between the resulting measured value of the operating indicator and the desired value of the operating indicator to be less than a desired difference value.

11. A system, comprising:
an integrated circuit;
a voltage supply configured to supply voltage to the integrated circuit responsive to a first signal;
first circuitry configured to obtain a first value of an operating indicator that is at least partially frequency dependent and related to performance of the integrated circuit; and
second circuitry configured to generate the first signal for control of the voltage supply using a comparison of the first value of the operating indicator to a target value of the operating indicator,
wherein the second circuitry includes a configuration to generate the signal to cause the voltage supply to provide a first voltage to reduce a magnitude of a difference between the first value of the operating indicator and the target value of the operating indicator.

12. The system as recited in claim 11, wherein:
the integrated circuit includes a processor.

13. The system as recited in claim 11, wherein:
the operating indicator is a highest frequency at which the processor is properly operable.

14. The system as recited in claim 11, wherein:
the operating indicator is additionally dependent upon a leakage current.

15. The system as recited in claim 11, wherein:
the operating indicator is a temperature.

16. The system as recited in claim 11, wherein:
the integrated circuit includes a configuration to operate at a first frequency; and
the first value of the operating indicator corresponds to operation at the first frequency.

17. The system as recited in claim 12, wherein:
the processor is configured such that operating in a first state corresponding to the first value of the operating indicator results in greater power consumption by the processor than a level of power consumption by the processor operating in a second state corresponding to the reduced magnitude of the difference between the first value of the operating indicator and the target value of the operating indicator.

18. The system as recited in claim 12, wherein:
the integrated circuit includes a configuration to change from operating at a first frequency to a second frequency;
the first circuitry includes a configuration to obtain a second value of the operating indicator corresponding to the second frequency;
the second circuitry includes a configuration to generate a second signal for control of the voltage supply using a comparison of the second value of the operating indicator to the target value and to generate the second signal to cause the voltage supply to provide a second voltage to reduce a magnitude of the difference between the second value of the operating indicator and the target value of the operating indicator.

19. A system, comprising:
an integrated circuit;
means for supplying an adjustable voltage to the integrated circuit;
means for measuring a value of an at least partially frequency dependent operating indicator; and
means for controlling the means for supplying an adjustable voltage to reduce a magnitude of a difference between the value of the operating indicator and a desired value of the operating indicator.

20. A method, comprising:
operating a processor in a first state;
measuring an operating indicator of the processor operating in the first state to obtain a first measured value of the operating indicator;
comparing the first measured value of the operating indicator to a desired value of the operating indicator;
determining a first value of a first voltage sufficient, if applied to the processor, to reduce a magnitude of a difference between the first measured value of the operating indicator and the desired value of the operating indicator; and
applying the first voltage to the processor to operate the processor in a second state, wherein operation of the processor in the first state corresponds to consumption of a greater amount of power by the processor than an amount of power consumed by the processor operating in the second state.

21. The method as recited in claim 20, wherein:
the operating indicator is at least partially frequency dependent.

22. The method as recited in claim 20, wherein:
the operating indicator is a temperature.

23. The method as recited in claim 20, wherein:
the operating indicator is additionally dependent upon a leakage current.

24. The method as recited in claim 21, wherein:
operating the processor in the first state includes operating the processor at a first frequency.

25. The method as recited in claim 24, further comprising:
changing operation of the processor to a second frequency;
measuring the operating indicator of the processor to obtain a second measured value of the operating indicator;
comparing the second measured value of the operating indicator to a second desired value of the operating indicator corresponding to the second frequency;
determining a second value of a second voltage sufficient, if applied to the integrated circuit, to reduce a magnitude of a difference between the second measured value of the operating indicator and the second desired value of the operating indicator; and
applying the second voltage to the integrated circuit.

26. A system, comprising:
a processor;
a voltage supply operable to supply a first voltage to the processor in response to a first signal and operable to supply a second voltage to the processor in response to a second signal;
a first circuit operable to determine a first value of a frequency dependent operating indicator related to operation of the processor at a frequency and operable to determine a second value of the operating indicator related to operation of the processor at the frequency;
a second circuit operable to generate the first signal and operable to generate the second signal, wherein the second circuit is operable to generate the second signal such that a magnitude of the difference between the second value of the operating indicator and the target value is less than a magnitude of the difference between the first value of the operating indicator and the target value.

27. The system as recited in claim 26, wherein:
operation of the processor at the first voltage corresponds to greater power consumption by the processor than operation of the processor at the second voltage.

28. The system as recited in claim 26, wherein:
the operating indicator includes temperature.

29. The system as recited in claim 26, wherein:
the frequency corresponds to a highest frequency at which the processor is properly operable.

30. The system as recited in claim 26, wherein:
the operating indicator includes leakage current.

* * * * *